United States Patent [19]

Sogo et al.

[11] Patent Number: 4,509,208
[45] Date of Patent: Apr. 2, 1985

[54] FREQUENCY CONVERSION UNIT

[75] Inventors: Hiroyuki Sogo, Tokyo; Zenichi Ohsawa, Yokohama; Isamu Umino, Kawasaki; Haruki Nishida, Yokohama, all of Japan

[73] Assignee: Fujitsu Limited, Kawasaki, Japan

[21] Appl. No.: 482,300

[22] Filed: Apr. 5, 1983

[30] Foreign Application Priority Data

Apr. 6, 1982 [JP] Japan .................................. 57-56092

[51] Int. Cl.³ .............................................. H04B 1/26
[52] U.S. Cl. ..................................... 455/317; 455/325; 455/327; 455/330; 455/332; 332/43 B
[58] Field of Search ............................... 455/325–327, 455/330, 332, 302, 317; 332/43 B

[56] References Cited

U.S. PATENT DOCUMENTS

| | | | |
|---|---|---|---|
| 3,159,790 | 12/1964 | Pratt | 455/326 |
| 3,233,194 | 2/1966 | Alford | 332/43 B |
| 3,243,731 | 3/1966 | Erickson | 332/43 B |
| 3,515,993 | 6/1970 | Merriam | 455/326 |
| 3,681,697 | 8/1972 | Moroney | 455/326 |
| 3,831,097 | 8/1974 | Neuf . | |
| 3,870,960 | 3/1975 | Hallford et al. . | |
| 4,099,126 | 7/1978 | Hallford . | |
| 4,118,670 | 10/1978 | Dickens . | |
| 4,249,263 | 2/1981 | Shinkawa et al. . | |
| 4,355,420 | 10/1982 | Ishihara | 455/317 |

FOREIGN PATENT DOCUMENTS

| | | |
|---|---|---|
| 2611712 | 9/1977 | Fed. Rep. of Germany . |
| 2944642 | 8/1980 | Fed. Rep. of Germany . |
| 2608939 | 6/1981 | Fed. Rep. of Germany . |
| 57-61311 | 4/1982 | Japan . |
| 1123227 | 8/1968 | United Kingdom . |
| 2023954 | 1/1980 | United Kingdom . |

OTHER PUBLICATIONS

"Phase and Amplitude Balance: Key to Image Rejection Mixers", Microwaves, Oct. 1972, pp. 64–70.
European Search Report, Dated: Aug. 1, 1983, Examiner: J. Breusing, Place: Berlin.

*Primary Examiner*—Jin F. Ng
*Attorney, Agent, or Firm*—Staas & Halsey

[57] ABSTRACT

A frequency conversion unit comprising a local oscillator, first and second mixers, first and second hybrid circuits. The mixers receive, via the first hybrid circuit, local oscillation outputs from the local oscillator, and the second hybrid circuit receives outputs from the first and second mixers, producing a frequency conversion output signal therefrom. Intermediate frequency signals used in the first and second mixers are $\pi$ radians out of phase with each other. The first hybrid circuit produces outputs for the first and second mixers having a predetermined phase difference of $\phi_1$ therebetween. The second hybrid circuit receives outputs from the first and second mixers and combines them after making a phase difference of $(\pi - \phi_1)$ therebetween.

12 Claims, 7 Drawing Figures

FREQUENCY CONVERSION UNIT

BACKGROUND OF THE INVENTION

1. Field of the Invention

The present invention relates to a frequency conversion unit, more particularly to a frequency conversion unit which contains a mixer which mixes an oscillation output from a local oscillator with an intermediate frequency input and thereby produces a frequency conversion output signal. The frequency conversion unit to which the present invention is concerned is mainly intended to be used in a communication system.

2. Description of the Prior Art

One of the functions required of a frequency conversion unit is low local frequency leakage. The local oscillation output for the frequency conversion should be used only for achieving the mixing of the frequencies. Therefore, the local oscillation output should not leak into the resultant frequency conversion output signal. That is, it is desirable to reduce the local leakage level to a very low level, zero if possible.

A typical frequency conversion unit, as described hereinafter, has a shortcoming of requiring an additional, special band elimination filter, a band-pass filter, and isolators for suppressing the local leakage. The isolators also absorb spurious waves and simultaneously match impedance.

To deal with the above shortcoming, U.S. Pat. No. 4,249,263 proposed a mixer circuit able to suppress the local leakage without employing such a special band elimination filter, a band-pass filter, or isolators. This mixer circuit, also described hereinafter, is not so superior in view of the poor impedance matching characteristics caused between the local oscillator and a circuit cooperating therewith.

SUMMARY OF THE INVENTION

It is an object of the present invention to provide a frequency conversion unit which can suppress local leakage without employing a special band elimination filter, a band-pass filter, or isolators and which, at the same time, exhibits superior impedance matching characteristics between the local oscillator and the circuit cooperating therewith.

The above object is attained by a frequency conversion unit in which two mixers are connected in parallel between an input side hybrid circuit and an output side hybrid circuit. In the output side hybrid circuit, the local leakage signals are selectively changed to have opposite phases to cancel each other and are then added with each other.

BRIEF DESCRIPTION OF THE DRAWINGS

The present invention will be more apparent from the ensuing description with reference to the accompanying drawings, wherein.

DESCRIPTION OF THE PREFERRED EMBODIMENTS

Figure 1:
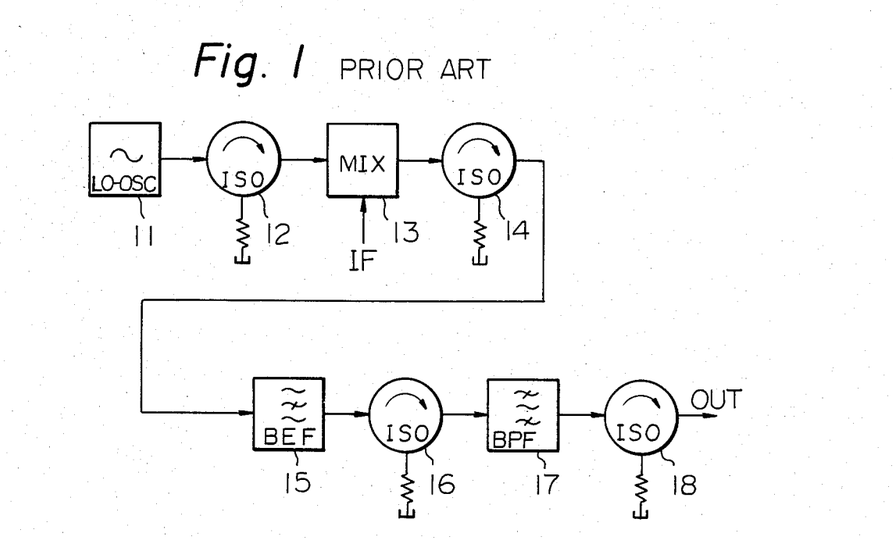
FIG. 1 is a block diagram of a typical frequency conversion unit.

FIG. 1 is a block diagram of a typical frequency conversion unit. In FIG. 1, a mixer (MIX) 13 is provided with a first input and a second input. The first input receives, via an isolator 12, a local oscillation output from a local oscillator (LO-OSC) 11. The second input receives an intermediate frequency signal IF which is mixed with the local oscillation output. The mixer 13 is a so-called single-balance type including two diodes therein. Thus, the mixer 13 produces a frequency conversion output signal having frequencies of $(f_{LO} \pm f_{IF})$ and, at the same time, a local leakage signal having a frequency of $f_{LO}$, where $f_{LO}$ denotes a local oscillation frequency and $f_{IF}$ denotes an intermediate frequency. Of these frequencies, only the desired frequency, i.e., $(f_{LO}+f_{IF})$ or $(f_{LO}-f_{IF})$, is extracted through a band pass filter (BPF) 17. This results in a frequency conversion output signal OUT. A band elimination filter (BEF) 15 functions to eliminate the local leakage signal. Isolators (ISO) 12, 14, 16 and 18 are inserted in the circuit for absorbing spurious waves and for impedance matching.

As mentioned above, this type of frequency conversion unit has shortcomings in that the band elimination filter 15 and band pass filter 17 are needed for suppressing the local leakage signal and the local leakage suppression is not perfect.

Figure 2:
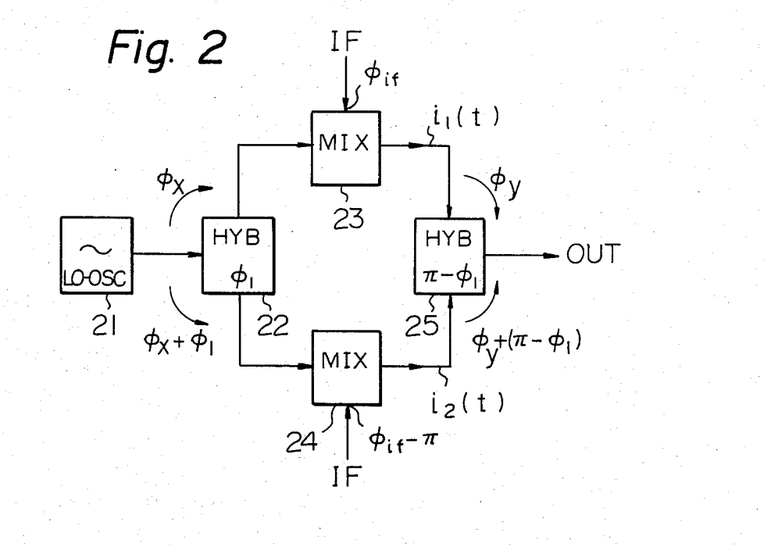
FIG. 2 is a block diagram representing an embodiment of to the present invention.

FIG. 2 is a block diagram representing an embodiment of the present invention. In this figure, the meanings of the characters IF and OUT are the same as mentioned with reference to FIG. 1. Also, a local oscillator (LO-OSC) 21 and mixers (MIX) 23 and 24 are identical to those having the same characters shown in FIG. 1. The difference between the frequency conversion units of FIGS. 1 and 2 is that a first hybrid circuit (HYB) 22 and a second hybrid circuit (HYB) 25 are introduced in the construction of FIG. 2 and two parallel-connected mixers are introduced therein.

Why and how the local leakage signal can be suppressed by the construction of FIG. 2 will be shown later using mathematical expressions. In brief, the local leakage signal travelling through the first mixer 23 and the local leakage signal traveling through the second mixer 24 are placed 90 radian out of phase with each other and then combined at the second hybrid circuit 25 so that only the local leakage signals are cancelled.

Incidentally, the first hybrid circuit 22 provides a power branching operation with a phase difference of $\phi_1$ (refer to $\phi_1$ in FIG. 2), while the second hybrid circuit 25 provides a power combining operation with a phase difference of $(\pi - \phi_1)$ (refer to $(\pi - \phi_1)$ in FIG. 2). Each of the hybrid circuits 22 and 25 is a 3 dB hybrid circuit.

Assume that a voltage $V_{LO}$ of a local oscillation output signal from the local oscillator 21 is expressed by the following expression (1):

$$V_{LO} = v_{LO} \sin(\omega_{LO} t + \phi_{LO}) \qquad (1)$$

where, the symbol $\phi_{LO}$ is an arbitrary phase for a general expression of $V_{LO}$ and $\omega_{LO}$ stands for $2\pi f_{LO}$.

A voltage $V_{LO(23)}$ of the local oscillation output signal to be input into the mixer 23 is expressed by the following expression (2), where the arbitrary phase is assumed to be zero for simplification:

$$V_{LO(23)} = \frac{1}{\sqrt{2}} v_{LO} \sin \omega_{LO} t \quad (2)$$

On the other hand, a voltage $V_{LO(24)}$ of the local oscillation output signal to be input into the mixer 24 is expressed by the following expression (3):

$$V_{LO(24)} = \frac{1}{\sqrt{2}} v_{LO} \sin(\omega_{LO} t - \phi_1) \quad (3)$$

where, $\phi_1$ is selected from the range of $+\pi \vee \phi_1 \geq 0$ and $v_{LO}$ denotes a peak amplitude of $V_{LO(24)}$.

Next, assume that a local leakage signal having a voltage $V_{LL(23)}$ is contained in the output signal from the mixer 23, where the voltage $V_{LL(23)}$ is expressed as follow:

$$V_{LL(23)} = v_{LL} \sin \omega_{LO} t \quad (4)$$

where, $v_{LL}$ denotes the effective voltage value of $V_{LL(23)}$. In this case, a voltage of the output signal from the mixer 24 is expressed as follows:

$$V_{LL(24)} = v_{LL} \sin(\omega_{LO} t - \phi_1) \quad (5)$$

When these local leakage signals pass through the hybrid circuit 25, the local leakage signal from the mixer 24 is shifted $(\pi - \phi_1)$ out of phase with respect to the local leakage signal from the mixer 23. Therefore, in hybrid circuit 25, the above recited $V_{LL(24)}$ of expression (5) is modified to be as follows:

$$\begin{aligned} V_{LL(24)} &= v_{LL} \sin\{\omega_{LO} t - \phi_1 - (\pi - \phi_1)\} \\ &= v_{LL} \sin(\omega_{LO} t - \pi) \end{aligned} \quad (6)$$

The $V_{LL(24)}$ of the expression (6) is clearly $\pi$ out of phase with respect to the $V_{LL(23)}$ of the expression (4).

Therefore, the local leakage can theoretically be suppressed to zero if the local leakage levels from the two mixers 23 and 24 are the same. This is the first feature of the construction shown in FIG. 2. It should be understood, however, that a feature identical to this first feature is also produced from the prior art mixer circuit in U.S. Pat. No. 4,249,263.

Regarding the phase $\phi_1$, according to the first feature mentioned above, the local leakage can be suppressed to zero at any value of the phase $\phi_1$ in the range from $|\phi_1|$ to $|\phi_1| = \pi$. There is a second feature regarding the above phase $\phi_1$. That is, when $\phi_1$ is selected to be $\phi_1 = +\pi/2$, a reflected wave from the mixer 23 and a reflected wave from the mixer 24 are $\pi$ out of phase with each other. Therefore, these reflected waves are cancelled. This leads to an improvement in the I/O impedance characteristics of the hybrid circuit 23.

Good impedance characteristics are provided in the unit of FIG. 1 by the isolator 12. It should be noted, however, that, in FIG. 2, if the hybrid 22 has inferior I/O impedance characteristics with respect to the local oscillator 21, the above-mentioned reflected waves will affect the local oscillator 21, with the result that the local oscillator 21 necessarily, will carry an unstable load. Thus, the oscillator 21 would be unable to maintain a stable oscillation frequency. On the other hand, the prior art mixer circuit has inferior I/O impedance characteristics.

Figure 3:
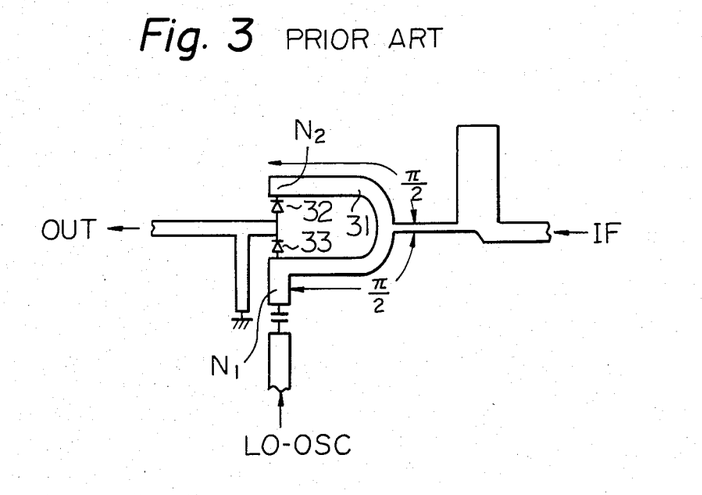
FIG. 3 is a diagram of a mixer circuit of the prior art.

FIG. 3 shows a mixer circuit of the prior art. This corresponds to FIG. 2 of U.S. Pat. No. 4,249,263. In this figure, the parts denoted by characters OUT, IF, and LO-OSC are substantially the same as those of FIGS. 1 and 2. The mixer circuit of FIG. 3 can suppress the aforesaid local leakage. This is because, a node $N_1$ and a node $N_2$ are linked with a $\frac{1}{4}$ wavelength line 31. Series-connected diodes 32 and 33 are sandwiched between these nodes $N_1$ and $N_2$. This means the local oscillation signal appearing at the node $N_2$ is $\pi$ radian out of phase with respect to the local oscillation signal. Accordingly, the local oscillation signals at the nodes $N_1$ and $N_2$ are cancelled, and thus the local leakage signal cannot appear in the frequency conversion output signal OUT.

However, as mentioned above, the mixer circuit of FIG. has inferior I/O impedance characteristics between the local oscillator (LO-OSC) and the circuit cooperating therewith. To be specific, the reflected wave from the cooperating circuit influences the local oscillation. To be more specific, the reflected wave, traveling from the node $N_1$, via the line 31, to the node $N_2$ and returning from the node $N_2$ and reaching, via the line 31, the node $N_1$, has $\pi$ $((\pi/2)+(\pi/2)+(\pi/2)+(\pi/2))$ radian phase difference with respect to the wave supplied at the node $N_1$. Consequently, the output of the oscillator is in phase with the above-mentioned reflected wave, and, thereby, the operation of the local oscillator (LO-OSC) is degraded by the reflected wave. As a result, the local oscillator cannot maintain stable oscillation.

Contrary to the above, in the present invention, the hybrid circuit 22 exhibits good I/O impedance characteristics when the phase $\phi_1$ of FIG. 2 is selected to be $+(\pi/2)$.

Figure 4:
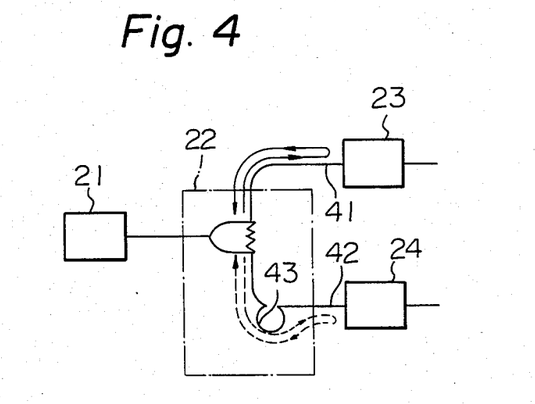
FIG. 4 is a circuit diagram of a hybrid circuit and its neighboring members in FIG. 2.

FIG. 4 is a schematic circuit diagram of the hybrid circuit 22 and it neighboring members in FIG. 2. Members identical to those of FIG. 2 are referenced by the same numerals. In FIG. 4, the reflected wave traveling along a line 41 is indicated by a solid line arrrow, while the reflected wave traveling along a line 42 is indicated by a broken line arrow. In this case, the reflected wave along the line 41 is $\pi$ $((\pi/2)+(\pi/2))$ radian out of phase with respect to the reflected wave along the line 42. This is because the line 42 is provided with a $\frac{1}{4}$ wavelength line 43 which creates a phase difference of $\phi_1$ $(= +(\pi/2))$. As a result, these reflected waves are cancelled and do not influence the local oscillator 21, thus providing the afore-mentioned second feature of the present invention.

Returning again to FIG. 2 and the last expression (6), explanations will be made of how although the local leakage is sufficiently suppressed, the desired frequency conversion output signal OUT is not suppressed and can pass, as it is, through the hybrid circuit 25. A differential conductance $g(t)$ can be expressed by expression (7) for diodes contained in the mixers (23, 24) which are energized by the local oscillation output signal:

$$g(t) = g_0 + \sum_{n=1}^{\infty} g_n \sin n \cdot (\omega_{LO} t - \phi_a)$$

where, the symbol $g_n$ denotes the differential conductance of the diode for the n-th order harmonic wave, denotes time, $g_0$ is average conductance and $\phi_a$ is an arbitrary phase in a mixer. Further, the voltage $e_{if}(t)$ of the intermediate frequency signal IF can be expressed by expression (8):

$$e_{if}(t) = E_{if}\cos(\omega_{if}t + \phi_{if}) \quad (8)$$

where, the symbol $E_{if}$ denotes the effective voltage value of $e_{if}$. The term $\omega_{if}$ equals $2\pi f_{IF}$. The the arbitrary phase is $\phi_{if}$ in the mixer 23 and $\phi_{if}$-$\pi$ in the mixer 24. The arbitrary phase $\phi_a$ of the first and second hybrid circuits 22 and 25 are $\phi_x$ and $\phi_y$, respectively. Assuming that g(t) and $e_{if}$ are determined as in expressions (7) and (8), respectively, a signal current i(t) obtained at the output of a mixer is determined by the following set of expressions (9):

$$i(t) = g(t) \cdot e_{if}(t) \quad (9)$$

$$= g_0 E_{if}\cos(\omega_{if}t + \phi_{if}) +$$

$$\sum_{n=1}^{\infty} \frac{g_n}{2} E_{if}[\sin\{(n\omega_{LO} + \omega_{if})t + (n\phi_a + \phi_{if})\} +$$

$$\sin\{(n\omega_{LO} - \omega_{if})t + (n\phi_a - \phi_{if})\}]$$

In the above expression (9), when a current i'(t), defined only by the first order harmonic wave component (n=1), is extracted selectively from the expressions, the current i'(t) can be expressed as follows:

$$i'(t) = \frac{g_1}{2} E_{if}[\sin\{(\omega_{LO} + \omega_{if})t + (\phi_a + \phi_{if})\} + \quad (10)$$

$$\sin\{(\omega_{LO} - \omega_{if})t + (\phi_a - \phi_{if})\}]$$

In the above expression (10), the first sine function represents a function relating to the upper frequencies of the first order harmonic wave, and the second sine function represents a function relating to the lower frequencies thereof.

Referring again to FIG. 2, a first order harmonic wave component current $i_1(t)$ of a signal converted in the mixer 23 can be expressed as follows, where the phase component $\phi_{LO}$ of the local oscillator (LO-OSC) is set at zero.

$$i_1(t) = \frac{g_1}{2} E_{if}[\sin\{(\omega_{LO} + \omega_{if})t - \phi_x + \phi_{if}\} + \quad (11)$$

$$\sin\{(\omega_{LO} - \omega_{if})t - \phi_x - \phi_{if}\}]$$

A first order harmonic wave component current $i_2(t)$ of a signal converted in the mixer 24 can be expressed as follows:

$$i_2(t) = \frac{g_1}{2} E_{if}[\sin\{(\omega_{LO} + \omega_{if})t - (\phi_x + \phi_1) + \quad (12)$$

$$(\phi_{if} - \pi)\} + \sin\{(\omega_{LO} - \omega_{if})t - (\phi_x + \phi_1) - (\phi_{if} - \pi)\}]$$

$$= \frac{g_1}{2} E_{if}[\sin\{(\omega_{LO} + \omega_{if})t - \phi_x - \phi_1 + \phi_{if} - \pi\} +$$

$$\sin\{(\omega_{LO} - \omega_{if})t - \phi_x - \phi_1 - \phi_{if} + \pi\}]$$

The aforesaid current $i_1(t)$ is transformed, in the second hybrid circuit 25, into a current $i'_1(t)$, as follows:

$$i'_1(t) = \frac{g_1}{2} E_{if}[\sin\{(\omega_{LO} + \omega_{if})t - \phi_x - \phi_y + \phi_{if}\} + \quad (13)$$

$$\sin\{(\omega_{LO} - \omega_{if})t - \phi_x - \phi_y - \phi_{if}\}]$$

Also, the aforesaid current $i_2(t)$ is transformed, when passed through the second hybrid circuit 25, into a current $i'_2(t)$, as follows:

$$i'_2(t) = \frac{g_1}{2} E_{if}[\sin\{(\omega_{LO} + \omega_{if})t - \phi_x - \phi_1 + \quad (14)$$

$$\phi_{if} - \pi - \phi_y - (\pi - \phi_1)\} + \sin\{(\omega_{LO} - \omega_{if})t -$$

$$\phi_x - \phi_1 - \phi_{if} + \pi - \phi_y - (\pi - \phi_1)\}]$$

$$= \frac{g_1}{2} E_{if}[\sin\{(\omega_{LO} + \omega_{if})t - \phi_x - \phi_y + \phi_{if} -$$

$$2\pi\} + \sin\{(\omega_{LO} - \omega_{if})t - \phi_x - \phi_y - \phi_{if}\}]$$

In the last term of expression (14), since a phase of $2\pi$ is the same as a phase of 0, the current $i'_2(t)$ can be rewritten as follows:

$$i'_2(t) = \frac{g_1}{2} E_{if}[\sin\{(\omega_{LO} + \omega_{if})t - \phi_x - \phi_y + \phi_{if}\} + \quad (15)$$

$$\sin\{(\omega_{LO} - \omega_{if})t - \phi_x - \phi_y - \phi_{if}\}]$$

The current $i'_1(t)$ of expression (13) the current $i'_2(t)$ of expression (15) are analyzed as follows. Regarding the current $i'_1(t)$ of expression (13), a current $i_{1u}(t)$ corresponding to an upper frequency component ($f_{LO}+f_{IF}$) of the first order harmonic wave signal passed through the mixer 23 is derived from expression (13) to be as follows:

$$i_{1u}(t) = \frac{g_1}{2} E_{if}\sin\{(\omega_{LO} + \omega_{if})t - \phi_x - \phi_y + \phi_{if}\} \quad (16)$$

Also regarding the current $i'_1(t)$ of expression (13), a current $i_{1l}(t)$ corresponding to a lower frequency component ($f_{LO}-f_{IF}$) of the first order harmonic wave signal passed through the mixer 23, is derived from expression (13) to be as follows:

$$i_{1l}(t) = \frac{g_1}{2} E_{if}\sin\{(\omega_{LO} - \omega_{if})t - \phi_x - \phi_y - \phi_{if}\} \quad (17)$$

Similarly, an upper frequency component current $i_{2u}(t)$ of the first order harmonic wave signal passed through the mixer 24 and a lower frequency component current $i_{2l}(t)$ thereof are expressed by the following expressions (18) and (19), respectively:

$$i_{2u}(t) = \frac{g_1}{2} E_{if}\sin\{(\omega_{LO} + \omega_{if})t - \phi_x - \phi_y + \phi_{if}\} \quad (18)$$

$$i_{2l}(t) = \frac{g_1}{2} E_{if}\sin\{(\omega_{LO} - \omega_{if})t - \phi_x - \phi_y - \phi_{if}\} \quad (19)$$

In the above-recited expressions (16) and (18), a look at the terms relating to the phases shows the phases to be in-phase, i.e., the same phase of ($\phi_x \pm \phi_y + \phi_{if}$). Therefore, a current $i_u(t)$ of the following expression (20) is obtained when the currents $i_{1u}(t)$ and $i_{2u}(t)$ are combined with each other by the second hybrid circuit 25:

$$i_u(t) = g_1 E_{if} \sin\{(\omega_{LO} + \omega_{if})t - \phi_x - \phi_y + \phi_{if}\} \quad (20)$$

Similarly, regarding the lower frequency component, a current $i_l(t)$ can be derived from the above expressions (17) and (18) to be as follows:

$$i_l(t) = g_1 E_{if} \sin\{(\omega_{LO} - \omega_{if})t - \phi_x - \phi_y - \phi_{if}\} \quad (21)$$

Thus, the mixed wave signals from the mixers remain as they are and are not suppressed. This is because the mixed wave signals from the mixers 23 and 24 are combined in phase with each other at the circuit 25.

All of the circuit elements for the embodiment of the present invention illustrated in FIG. 2 can easily be realized. Further, the intermediate frequency signals IF for the mixers 23 and 24 are produced by means of a 3 dB-180° hybrid circuit.

Figure 5:
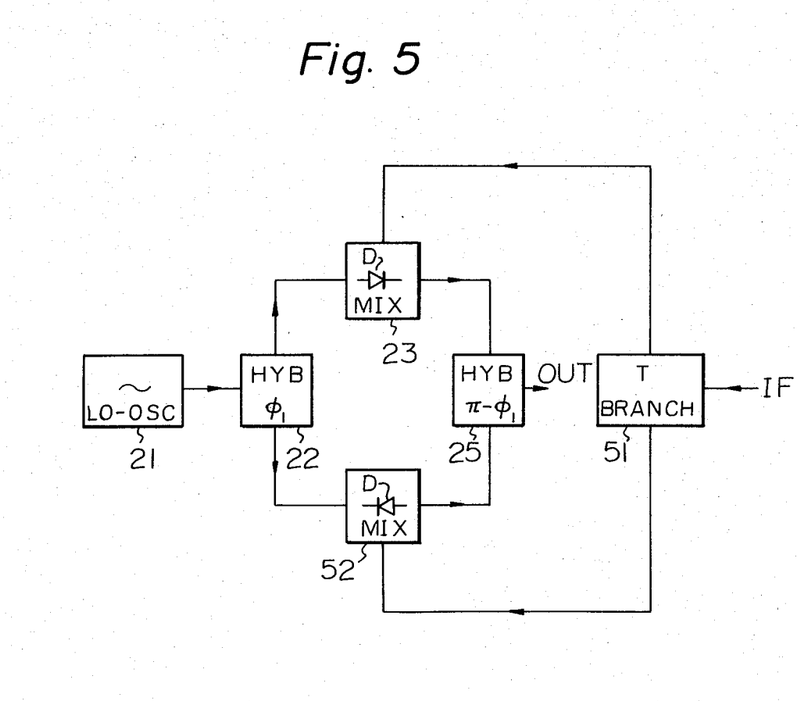
FIG. 5 is a block diagram representing another embodiment of to the present invention.

FIG. 5 is a block diagram representing another embodiment of the preent invention. Differences between the constructions of FIG. 5 and FIG. 2 are, first, the aforesaid 3 dB-180° hybrid circuit is replaced by an ordinary T-branch circuit 51; and, second, the diodes D comprising the mixer 52 are mounted in inverse polarity to the diodes D in the mixer 23. Therefore, in the embodiment of FIG. 5, the intermediate frequency signal IF for the mixer 23 can also be 180° out of phase with respect to the signal IF for the mixer 52.

Figure 6:
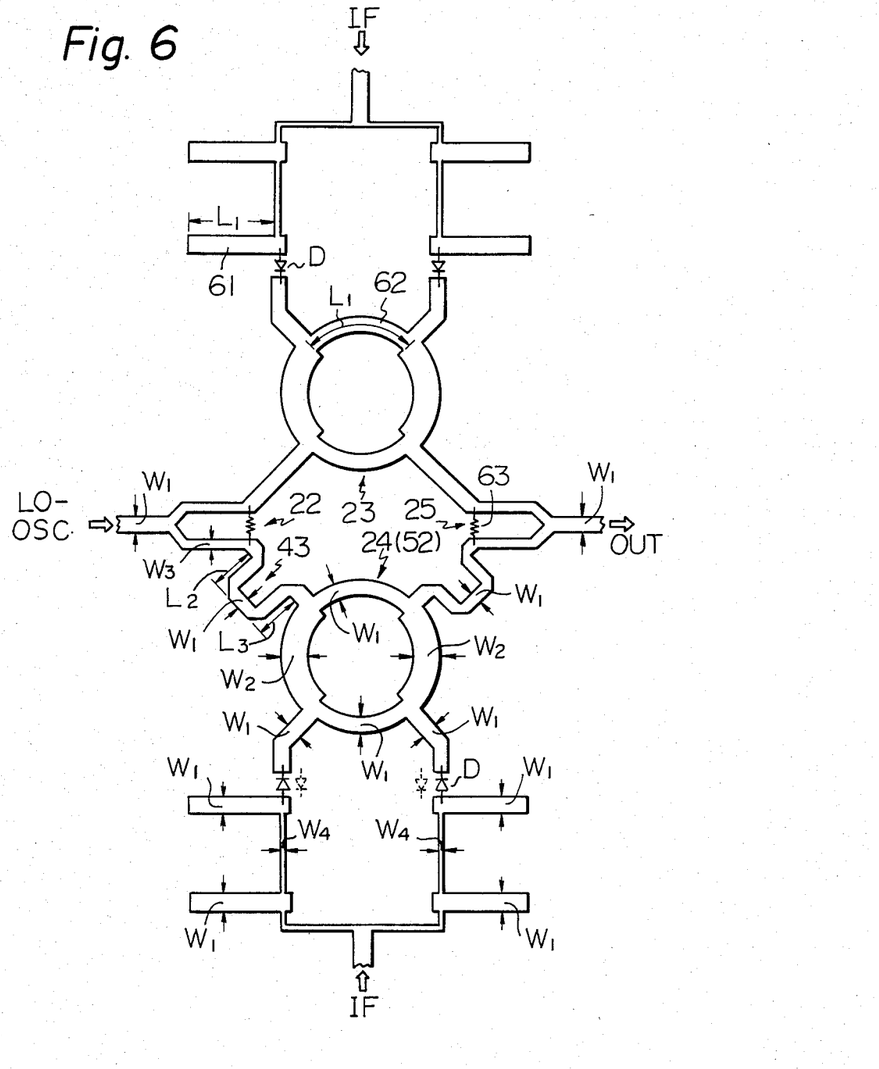
FIG. 6 is a plan view of a first example of an actual circuit pattern for fabrication of the frequency conversion units illustrated in FIGS. 2 and 5.
Figure 7:
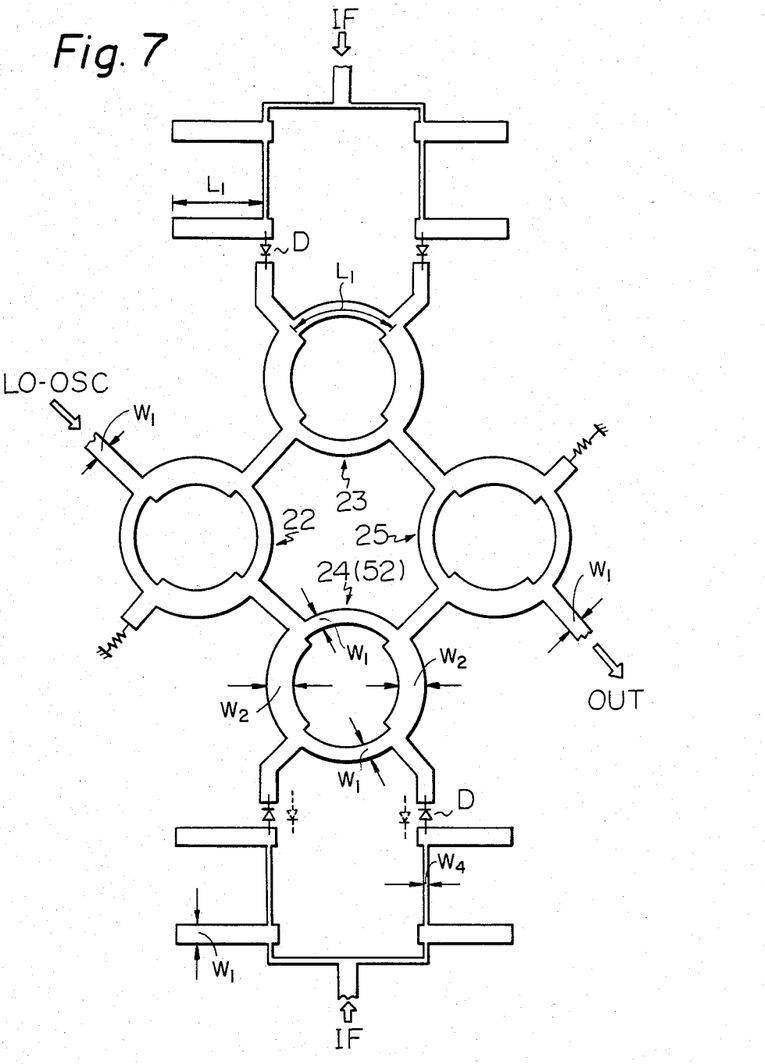
FIG. 7 is a plan view of a second example of an actual circuit pattern for fabrication of the frequency conversion units illustrated in FIGS. 2 and 5.

FIG. 6 is a plan view of a first example of an actual circuit pattern for fabrication of the frequency conversion unit illustrated in FIG. 2. FIG. 7 is a plan view of a second example of an actual circuit pattern for fabrication of the frequency conversion unit illustrated in FIG. 2. In FIGS. 6 and 7, members corresponding to those of FIGS. 2 and 4 are indicated by the same reference numerals, symbols, and characters.

In FIG. 6, the length of a line or appendage 61 is preferably the same as that of a line 62, i.e., $L_1$. The length $L_1$ is determined as the sum of lengths $L_2$ and $L_3$ of the U-shaped line 43. When the width $W_1$ is normalized as 1, then the width $W_2$ becomes 2, the width $W_3$ becomes 0.5, and the width $W_4$ of the arm of the U-shaped circuit pattern becomes 0.2. The resistance value of the resistor 63 across the arms of the U-shaped circuit pattern in the hybrid circuit 22 is predetermined to match the value of the characteristic impedance of a cooperating transmission line. The portion 24 (mixer 24 in FIG. 2) is the same as the portion 52 (mixer 52 in FIG. 5), except that the diodes D connected to the arms of the ring-shaped mixer 52 are arranged inversely in polarity with respect to the diodes D of the mixer 24, as are the diodes indicated by broken lines. The diodes D, length $L_1$ and widths $W_1$, $W_2$ and $W_4$ in FIG. 7 are the same as the correspondingly labelled portions of FIG. 6.

In FIG. 6, the first hybrid circuit 22, a power branching circuit, comprises two U-shaped circuit patterns with the local oscillator connected to the base of one of the U-shaped circuit patterns. The U-shaped circuit patterns each have two arms and are connected at the end of one of their arms. A resistor is connected across the arms of the U-shaped circuit pattern connected to the local oscillator. The second hybrid circuit 25, a power combining circuit, in FIG. 6 has a structure which is the mirror image of the first hybrid circuit 22 and includes two U-shaped circuit patterns with two arms each and a resistor connected across the arms of one of the U-shaped circuit patterns.

The mixers 23 and 24 in FIG. 6 each include another U-shaped circuit pattern having a base which receives an intermediate frequency signal. The U-shaped circuit pattern in the mixers has two arms, each of which has two appendages. Each of the mixers also include a ring-shaped circuit pattern having four arms, two of which are connected to the arms of the U-shaped circuit pattern via diodes and two of which are connected to the first and second hybrid circuits 22 and 25. The arms of the ring-shaped circuit patterns are located every 90° or $\pi/2$ radians of arc around the ring. Thus, each arm is diametrically opposite another arm. The arms, the appendages on the arms and the arcs of the ring-shaped circuit patterns between the arms in the mixers 23 and 24 as well as the arms of the U-shaped circuit pattern in the first and second hybrid circuits 22 and 25 have the relative length and widths specified above. In FIG. 7, the first and second hybrid circuits 22 and 25 comprise ring-shaped circuit patterns which have the same shape as the ring-shaped circuit patterns of the mixers 23 and 24.

As explained above in detail, according to the frequency conversion unit of the present invention, local leakage can theoretically be suppressed completely. Therefore, the special band elimination filter and the band pass filter can be omitted. Further, the local oscillator can produce a stable oscillation frequency signal. Furthermore, the backoff characteristic can be improved, because each of the two mixers receives the 3 dB reduced local oscillation signals via the first hybrid circuit. Therefore, each mixer can operate with a larger dynamic range, compared with a single mixer which receives a full level local oscillation signal.

We claim:

1. A frequency conversion unit receiving an intermediate frequency signal, comprising:
   local oscillator means for supplying an oscillation output;
   first mixer means, operatively connected to receive the intermediate frequency signal, for producing a first mixed frequency signal;
   second mixer means, operatively connected to receive the intermediate frequency signal, for producing a second mixed frequency signal, the intermediate frequency signal in said second mixer means being $\pi$ radians out of phase with the intermediate frequency signal in said first mixer means;
   a first hybrid circuit, operatively connected to said local oscillator, said first mixer means and said second mixer means, for producing two outputs having a phase difference of a predetermined value $\phi_1$ therebetween; and
   a second hybrid circuit, operatively connected to said first mixer means and said second mixer means, for producing a frequency conversion output signal, said second hybrid circuit phase-shifting the second mixed frequency signal by a predetermined value $(\pi - \phi_1)$ prior to mixing the first and second mixed frequency signals.

2. A frequency conversion unit as set forth in claim 1, wherein said value $\phi_1$ is selected from a range $+\pi \geq \phi_1 \geq 0$.

3. A frequency conversion unit as set forth in claim 1, wherein each of said first and second hybrid circuits comprises as a 3 dB hybrid circuit.

4. A frequency conversion unit as set forth in claim 1, wherein said first mixer means comprises a diode mixer, comprising two diodes, and wherein said second mixer means comprises a diode mixer, comprising two diodes arranged in inverse polarity with respect to the two diodes in said first mixer means and, thereby, the intermediate frequency signal in said first mixer means is $\pi$ radians out of phase with respect to the intermediate frequency in the second mixer means.

5. A frequency conversion unit as set forth in claim 4, further comprising:

means for providing an undivided intermediate frequency signal; and a T-branch circuit operatively connected to said means for providing the undivided intermediate frequency signal, said first mixer means and said second mixer means.

6. A frequency conversion unit as set forth in claim 1, wherein said value $\phi_1$ is $+\pi/2$.

7. A frequency conversion unit receiving an intermediate frequency signal, comprising:

local oscillator means for supplying an oscillation output;

first mixer means, operatively connected to receive the intermediate frequency signal, for producing a first mixed frequency signal, comprising:

a first U-shaped circuit pattern having a base receiving the intermediate frequency signal, a first arm and a second arm;

a first diode operatively connected to the first arm of said first U-shaped circuit pattern;

a second diode operatively connected to the second arm of said first U-shaped circuit pattern; and a first ring-shaped circuit pattern, having a first arm operatively connected to said first diode, a second arm at a distance of $\pi/2$ radians of arc from the first arm, operatively connected to said second diode, a third arm diametrically opposite the first arm and a fourth arm diametrically opposite the second arm;

second mixer means, operatively connected to receive the intermediate frequency signal, for producing a second mixed frequency signal, the intermediate frequency signal in said second mixer means being $\pi$ radians out of phase with the intermediate frequency signal in said first mixer means, said second mixer means comprising:

a second U-shaped circuit pattern having a base receiving the intermediate frequency signal, a first arm and a second arm;

a third diode operatively connected to the first arm of said second U-shaped circuit pattern;

a fourth diode operatively connected to the second arm of said second U-shaped circuit pattern; and a second ring-shaped circuit pattern, having a first arm operatively connected to said third diode, a second arm at a distance of $\pi/2$ radians of arc from the first arm, operatively connected to said fourth diode, a third arm diametrically opposite the first arm and a fourth arm diametrically opposite the second arm;

a first hybrid circuit, operatively connected to said local oscillator, said first mixer means and said second mixer means, for producing two outputs having a phase difference of a predetermined value $\phi_1$ therebetween, said first hybrid circuit comprising:

a third U-shaped circuit pattern having a base operatively connected to said local oscillator means for receiving the oscillation output, a first arm operatively connected to the fourth arm of the first ring-shaped circuit pattern and a second arm;

a first resistor operatively connected to the first and second arms of said third U-shaped circuit pattern; and a fourth U-shaped circuit pattern operatively connected to the second arm of the third U-shaped circuit pattern and the third arm of said second ring-shaped circuit pattern; and a second hybrid circuit, operatively connected to said first mixer means, and said second mixer means for producing a frequency conversion output signal, said second hybrid circuit phase-shifting the second mixed frequency signal by a predetermined value $(\pi-\phi_1)$ prior to mixing the first and second mixed frequency signals, said second hybrid circuit comprising:

a fifth U-shaped circuit pattern supplying the frequency conversion output signal, having a first arm operatively connected to the third arm of said first ring-shaped circuit pattern, and a second arm;

a second resistor operatively connected to the first and second arms of the fifth U-shaped circuit pattern; and a sixth U-shaped circuit pattern operatively connected to the second arm of the fifth U-shaped circuit pattern and the fourth arm of the second ring-shaped circuit pattern.

8. A frequency conversion unit as set forth in claim 7, wherein said first and second ring-shaped circuit patterns have the same dimensions and each further comprises:

a first arc between the first and second arms having a width W;

a second arc between the second and third arms having a width 2 W;

a third arc between the third and fourth arms having the width W; and a fourth arc between the fourth and first arms having the width 2 W, wherein the first and second arms of the first U-shaped circuit pattern have a width W/5 and the appendages of the first U-shaped circuit pattern have the width W and a length equal to the $\pi/2$ radians of arc of said first and second ring-shaped circuit patterns, and said second U-shaped circuit pattern has the same dimensions as said first U-shaped circuit pattern, wherein said third and fifth U-shaped circuit patterns have the same dimensions, the arms of both of said third and fifth U-shaped circuit patterns having a width W/2, and wherein said fourth and sixth U-shaped circuit patterns have the same shape and dimensions and have a base of width W and arms having a total length equal to the $\pi/2$ radians of arc of said first and second ring-shaped circuit patterns.

9. A frequency conversion unit as set forth in claim 7, wherein the first and second arms in said first and second U-shaped circuit patterns each have two appendages.

10. A frequency conversion unit receiving an intermediate frequency signal, comprising:

local oscillator means for supplying an oscillation output;

first mixer means, operatively connected to receive the intermediate frequency signal, for producing a first mixed frequency signal, comprising:
- a first U-shaped circuit pattern having a base receiving the intermediate frequency signal, a first arm and a second arm;
- a first diode operatively connected to the first arm of said first U-shaped circuit pattern;
- a second diode operatively connected to the second arm of said first U-shaped circuit pattern; and
- a first ring-shaped circuit pattern, having a first arm operatively connected to said first diode, a second arm at a distance of $\pi/2$ radians of arc from the first arm, operatively connected to said second diode, a third arm diametrically opposite the first arm and a fourth arm diametrically opposite the second arm;

second mixer means, operatively connected to receive the intermediate frequency signal, for producing a second mixed frequency signal, the intermediate frequency signal in said second mixing means being $\pi$ radians out of phase with the intermediate frequency signal in said first mixer means, said second mixer means comprising:
- a second U-shaped circuit pattern having a base receiving the intermediate frequency signal, a first arm and a second arm;
- a third diode operatively connected to the first arm of said second U-shaped circuit pattern;
- a fourth diode operatively connected to the second arm of said second U-shaped circuit pattern; and
- a second ring-shaped circuit pattern, having a first arm operatively connected to said third diode, a second arm at a distance of $\pi/2$ radians of arc from the first arm, operatively connected to said fourth diode, a third arm diametrically opposite the first arm and a fourth arm diametrically opposite the second arm;

a first hybrid circuit, operatively connected to said local oscillator, said first mixer means and said second mixer means, for producing two outputs having a phase difference of a predetermined value $\phi_1$ therebetween, said first hybrid circuit comprising a third ring-shaped circuit pattern having a first arm operatively connected to ground, a second arm at a distance of $\pi/2$ radians of arc from the first arm, operatively connected to said local oscillator means, a third arm diametrically opposite the first arm, operatively connected to the fourth arm of said first ring-shaped circuit pattern, and a fourth arm diametrically opposite the second arm, operatively connected to the third arm of said second ring-shaped circuit pattern; and a second hybrid circuit, operatively connected to said first mixer means and said second mixer means, for producing a frequency conversion output signal, said second hybrid circuit phase-shifting the second mixed frequency signal by a predetermined value $(\pi = \phi_1)$ prior to mixing the first and second mixed frequency signals, said second hybrid circuit, comprising a fourth ring-shaped circuit pattern having a first arm operatively connected to ground, a second arm at a distance of $\pi/2$ radians of arc from the first arm, supplying the frequency conversion output signal, a third arm diametrically opposite the first arm, operatively connected to the fourth arm of said second ring-shaped circuit pattern, and a fourth arm diametrically opposite the second arm, operatively connected to the third arm of said first ring-shaped circuit pattern.

11. A frequency conversion unit as set forth in claim 10, wherein said first, second, third and fourth ring-shaped circuit patterns have the same dimensions, the first, second, third and fourth arms of each ring-shaped circuit pattern having a width W, each ring-shaped circuit pattern further comprising a first arc between the first and second arms having the width W, a second arc between the second and third arms having a width 2 W, a third arc between the third and fourth arms having the width W and a fourth arc between the fourth and first arms having the width 2 W, and wherein the arms of said first U-shaped circuit pattern has a width W/5 and the appendages of said first U-shaped circuit pattern has a width of W and a length equal to $\pi/2$ radians of arc of said ring-shaped circuit patterns, and said first and second U-shaped circuit patterns have the same dimensions.

12. A frequency conversion unit as set forth in claim 10, wherein the first and second arms in said first and second U-shaped circuit patterns each have two appendages.

* * * * *

UNITED STATES PATENT AND TRADEMARK OFFICE
CERTIFICATE OF CORRECTION

PATENT NO. : 4,509,208
DATED : April 2, 1985
INVENTOR(S) : Sogo et al.

It is certified that error appears in the above-identified patent and that said Letters Patent is hereby corrected as shown below:

Col. 1, line 54, "with" should be --to cancel--.
Col. 2, line 53, "90" should be --$\pi$--.
Col. 3, line 19, "$\sqrt{}$" should be --$\geq$--;
line 24, "follow" should be --follows--;
line 54, "$|\phi_1|$" should be --$|\phi_1| = 0$--;

line 61, "23" should be --22--.

Col. 6, line 66, "$\pm$" should be --+--; "+" should be --$\pm$--.

Col. 7, line 23, "preent" should be --present--.

Signed and Sealed this

Tenth Day of September 1985

[SEAL]

Attest:

DONALD J. QUIGG

*Attesting Officer*   Acting Commissioner of Patents and Trademarks - Designate